(12) United States Patent
Lam

(10) Patent No.: US 7,981,796 B2
(45) Date of Patent: Jul. 19, 2011

(54) METHODS FOR FORMING PACKAGED PRODUCTS

(75) Inventor: Ken M. Lam, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 12/683,357

(22) Filed: Jan. 6, 2010

(65) Prior Publication Data
US 2010/0172113 A1    Jul. 8, 2010

Related U.S. Application Data

(62) Division of application No. 11/380,477, filed on Apr. 27, 2006, now abandoned.

(51) Int. Cl.
*H01L 21/44* (2006.01)
*H01L 21/50* (2006.01)
*H01L 21/48* (2006.01)

(52) U.S. Cl. ........ 438/667; 438/637; 438/675; 438/617; 438/123

(58) Field of Classification Search .................. 438/667, 438/637, 675, 617, 123
See application file for complete search history.

(56) References Cited

U.S. PATENT DOCUMENTS

| | | |
|---|---|---|
| 5,585,675 A | 12/1996 | Knopf |
| 5,744,827 A | 4/1998 | Jeong et al. |
| 6,038,133 A | 3/2000 | Nakatani et al. |
| 6,294,407 B1 | 9/2001 | Jacobs |
| 6,320,251 B1 | 11/2001 | Glenn |
| 6,414,391 B1 | 7/2002 | Corisis et al. |
| 6,489,676 B2 | 12/2002 | Taniguchi et al. |
| 6,563,217 B2 | 5/2003 | Corisis et al. |
| 6,613,606 B1 | 9/2003 | Lee |
| 6,674,159 B1 | 1/2004 | Peterson et al. |
| 6,740,964 B2 * | 5/2004 | Sasaki ........................ 257/687 |
| 6,784,530 B2 | 8/2004 | Sugaya et al. |
| 6,838,768 B2 | 1/2005 | Corisis et al. |
| 7,034,386 B2 * | 4/2006 | Kurita ........................ 257/685 |
| 7,242,081 B1 * | 7/2007 | Lee ............................ 257/686 |
| 7,564,137 B2 | 7/2009 | Lam |
| 7,791,206 B2 * | 9/2010 | Takeuchi et al. ............. 257/774 |
| 2002/0125571 A1 | 9/2002 | Corisis et al. |
| 2003/0038378 A1 | 2/2003 | Jacobs |

(Continued)

FOREIGN PATENT DOCUMENTS

WO    WO-2007127739 A2    11/2007

(Continued)

OTHER PUBLICATIONS

"U.S. Appl. No.11/380,477 Non-Final Office Action mailed Aug. 6, 2009", 8 pgs.

(Continued)

*Primary Examiner* — Luan C Thai
(74) *Attorney, Agent, or Firm* — Fish & Richardson P.C.

(57) ABSTRACT

An apparatus and methods for packaging semiconductor devices are disclosed. The apparatus is applicable to many types of contemporary packaging schemes that utilize a sacrificial metal base strip. Tunnels formed through an encapsulation area surrounding the device and associated bond wires are filled with a metallic conductor by, for example, electroplating, and extend bottom contact pads to an uppermost portion of the encapsulated area. The sacrificial metal base strip serves as a plating bus and is etch-removed after plating. The filled tunnels allow components to be stacked in a three-dimensional configuration.

18 Claims, 4 Drawing Sheets

U.S. PATENT DOCUMENTS

| | | |
|---|---|---|
| 2003/0197271 A1 | 10/2003 | Corisis et al. |
| 2005/0006768 A1 | 1/2005 | Narasimhan et al. |
| 2005/0035357 A1 | 2/2005 | Fjelstad |
| 2005/0067680 A1 | 3/2005 | Boon et al. |
| 2005/0110135 A1 | 5/2005 | Corisis et al. |
| 2005/0218499 A1 | 10/2005 | Chang et al. |
| 2006/0022332 A1 | 2/2006 | Koyama et al. |
| 2006/0027908 A1 | 2/2006 | Chang et al. |
| 2007/0252255 A1 | 11/2007 | Lam |
| 2007/0262435 A1 | 11/2007 | Lam |
| 2009/0302449 A1 | 12/2009 | Lam |

FOREIGN PATENT DOCUMENTS

| | | | |
|---|---|---|---|
| WO | WO-2007127739 A3 | 11/2007 | |
| WO | WO-2008057739 A2 | 5/2008 | |
| WO | WO-2008057739 A3 | 5/2008 | |

OTHER PUBLICATIONS

"U.S. Appl. No. 11/380,477, Amendment and Response filed May 12, 2008 to Non-Final Office Action mailed Feb. 12, 2008", 15 pgs.

"U.S. Appl. No. 11/380,477, Non-Final Office Action mailed Feb. 12, 2008", 10 pgs.

"U.S. Appl. No. 11/380,477, Final Office Action mailed on Mar. 10, 2009", 8 pgs.

"U.S. Appl. No. 11/380,477, Response filed Sep. 22, 2008 to Restriction Requirement mailed Aug. 22, 2008", 11 pgs.

"U.S. Appl. No. 11/380,477, Response filed Jul. 10, 2009 to Final Office Action mailed Mar. 10, 2009", 12 pgs.

"U.S. Appl. No. 11/380,477, Restriction Requirement Mailing Date: Aug. 22, 2008", 410 pgs.

"U.S. Appl. No. 11/557,879, Notice of Allowance mailed Apr. 7, 2009", 8 pgs.

"U.S. Appl. No. 11/557,879, Amendment and Response filed May 13, 2008 to Non-Final Office Action mailed Feb. 13, 2008", 18 pgs.

"U.S. Appl. No. 11/557,879, Advisory Action mailed Mar. 6, 2009", 3 pgs.

"U.S. Appl. No. 11/557,879, Amendment Under 37 C.F.R. Sec. 1.312 filed Jun. 4, 2009", 8 pgs.

"U.S. Appl. No. 11/557,879, Non-Final Office Action mailed Feb. 13, 2008", 7 pgs.

"U.S. Appl. No. 11/557,879, Response filed Feb. 19, 2009 to Final Office Action mailed Nov. 19, 2008", 13 pgs.

"U.S. Appl. No. 11/557,879, Final Office Action mailed Nov. 19, 2008", 7 pgs.

"U.S. Appl. No. 11/557,879, Response filed Sep. 22, 2008 to Restriction Requirement mailed Aug. 22, 2008", 12 pgs.

"U.S. Appl. No. 11/557,879, Restriction Requirement mailing date: Aug. 22, 2008", 5 pgs.

"International Application No. PCT/US07/67315, International Search Report mailed Mar. 21, 2008", 2 pgs.

"International Application No. PCT/US07/67315, Written Opinion mailed Mar. 21, 2008", 4 pgs.

"International Application No. PCT/US07/82002, International Search Report mailed Apr. 25, 2008", 2 pgs.

"International Application No. PCT/US07/82002, Written Opinion mailed Apr. 25, 2008", 6 pgs.

"U.S. Appl. No. 11/557,879, Amendment filed Jun. 4, 2009 as a Response to the Notice of Allowance mailed Apr. 7, 2009", 8 pgs.

"U.S. Appl. No. 11/557,879, Response to Rule 312 Communication mailed Jun. 18, 2009", 2 pgs.

"U.S. Appl. No. 12/479,407, Non-Final Office Action mailed May 20, 2010", 5 pgs.

"U.S. Appl. No. 12/479,407, Response filed Jun. 30, 2010 to Non Final Office Action mailed May 20, 2010", 6 pgs.

"Chinese Application Serial No. 200780014844.X, Office Action Dec. 18, 2009", (w/ English Translation)., 15 pgs.

"Chinese Application Serial No. 200780014844.X, Response filed Apr. 16, 2010 to Office Action Dec. 18, 2009", (w' English Translation), 14 pgs.

"International Application Serial No. PCT/US07/67315, International Preliminary Report on Patentability mailed Aug. 12, 2008", 5 pgs.

"U.S. Appl. No. 12/479,407 Notice of Allowance mailed Sep. 24, 2010", 4 pgs.

"U.S. Appl. No. 12/479,407, Notice of Allowance mailed 0-02-11", 6 pgs.

* cited by examiner

METHODS FOR FORMING PACKAGED PRODUCTS

RELATED APPLICATIONS

This application is a divisional of U.S. patent application Ser. No. 11/380,477, filed on Apr. 27, 2006, which is incorporated herein by reference in its entirety.

TECHNICAL FIELD

Embodiments of the invention relate generally to forming packaged products, and more particularly, to forming three-dimensional stackable semiconductor packages for package types having a sacrificial metal base.

BACKGROUND

As semiconductor integrated circuit chips become more multi-functional and highly integrated, the chips include more bonding pads (or terminal pads), and thus packages for the chips have more external terminals (or leads). When a conventional plastic package having leads along the perimeter of the package must accommodate a large number of leads, the footprint of the package increases.

However, a goal in many electronic systems is to minimize an overall size of the systems. Thus, to accommodate a large number of pins without increasing the footprint of package, pin pitch (or lead pitch) of the package must decrease. However, a pin pitch of less than about 0.4 mm gives rise to many technical concerns. For example, trimming of a package having a pin pitch less than 0.4 mm requires expensive trimming tools. Furthermore, the leads are prone to bending during handling of the package. In addition, surface-mounting of such packages demands a costly and complicated surface-mounting process due to a required critical alignment step.

Thus, to avoid technical problems associated with conventional fine-pitch packages, packages having area array external terminals have been suggested, such as a ball grid array package or chip scale package (e.g., micro ball grid array package (μBGA) and a bump chip carrier (BCC)). A μBGA package includes a polyimide tape on which a conductive pattern is formed. Such a package employs a different manufacturing process as compared to conventional plastic packaging. The BCC, on the other hand, includes a substrate having grooves formed around a central portion of a top surface of a copper alloy plate, and an electroplating layer formed in the grooves. Accordingly, chip scale packages utilize specialized packaging materials and processes which increase package manufacturing costs.

An integrated circuit package using conventional packaging materials and processes can only be accessed for electrical interconnection, for example, to a printed circuit board, by the bump pads on the bottom surface 121 of the package. See, for example, FIGS. 1A through 1C, which illustrate plan and cross-sectional views of a conventional apparatus for manufacturing leadless BCC packages.

With reference to the plan view of FIG. 1A, a conventional metal carrier matrix array 101 has an upper surface 103, which includes an encapsulating matrix 105 with a plurality of sawing lines 107.

The cross-sectional view of FIG. 1B shows a plurality of bump pads 109 and a plurality of die pads 111 formed on the upper surface 103 of the metal carrier 101 by plating. Back surfaces of integrated circuit dice 113 are attached to corresponding die pads 111. A plurality of bonding wires 115 connect a plurality of bonding pads 117 on active surfaces of the dice 113 to corresponding bump pads 109. An encapsulant 119 encapsulates the encapsulating matrix 105, including the dice 113 and the bonding wires 115.

With reference to the underside plan view of FIG. 1C, after etching away the metal carrier 101 (not shown in FIG. 1C), the bump pads 109 and the die pads 111 are exposed from the bottom surface 121 of the encapsulant 119. Thereafter, the encapsulant 119 is singulated by sawing along the sawing lines 107 to form a plurality of individual BCC packages.

SUMMARY

Embodiments described herein provide for a higher density of integrated circuit packaging into a given printed circuit board footprint by allowing the integrated circuit packages to be stacked, one atop another. Embodiments of the present invention therefore include an apparatus and a method for packaging semiconductor devices.

Embodiments of the apparatus are applicable to many types of contemporary packaging schemes that utilize a sacrificial metal base strip. Tunnels formed through an encapsulation volume surrounding the device and associated bond wires are filled with a metallic conductor by, for example, electroplating. The filled tunnels extend bottom contact pads to an uppermost portion of the encapsulated area. The sacrificial metal base strip serves as a plating bus and is etch-removed after plating. The filled tunnels allow components to be stacked in a three-dimensional configuration. In a specific exemplary embodiment, embodiments of the invention may be applied to multiple dice or combinations of circuits and dice within stackable packages. Each of the stackable packages may then be stacked three-dimensionally while not increasing an overall footprint size of a mounting area on, for example, a printed circuit board.

The present invention is thus, in an exemplary embodiment, a semiconductor package matrix. The semiconductor package matrix includes a plurality of three-dimensional stackable semiconductor packages arranged side-by-side in an array within the matrix and separated by kerf regions. The kerf regions are located at an outermost periphery of each of the plurality of three-dimensional stackable semiconductor packages. Each of the plurality of three-dimensional stackable semiconductor packages includes an area for mounting an integrated circuit die, and/or one or more discrete electrical components, and a plurality of wirebond pads substantially coplanar with a die mounting area. Each of the plurality of wirebond pads allows a bonding wire to provide electrical communication from either the integrated circuit die and/or the one or more discrete electrical components to outside of the packaged device.

Embodiments of the invention include a mold cap, which has a lowermost portion and an uppermost portion. The lowermost portion is at a level substantially coplanar with the die mounting area and the plurality of wirebond pads. The mold cap has a plurality of conducting contact tunnels, each of which is associated and arranged to be in electrical communication with a corresponding one of the plurality of wirebond pads once a conducting material fills the conducting contact tunnel. The plurality of conducting contact tunnels extend from an uppermost portion of the plurality of wirebond pads to the uppermost portion of the mold cap.

Embodiments of the present invention also include a method of packaging a semiconductor device (or plurality of devices within a single package). An exemplary embodiment of the method includes mounting an electrical component to a die mounting area and securing a plurality of bond wires from a plurality of bond pads on the electrical component to corresponding ones of a plurality of wirebond pads.

A mold cavity is provided which has a plurality of conducting contact tunnels disposed over the plurality of wirebond pads. The electrical components and bond wires are encapsulated with a mold compound, substantially filling the mold cavity. The plurality of conducting contact tunnels are then filled with an electrically conductive material.

DETAILED DESCRIPTION

Figure 1A:
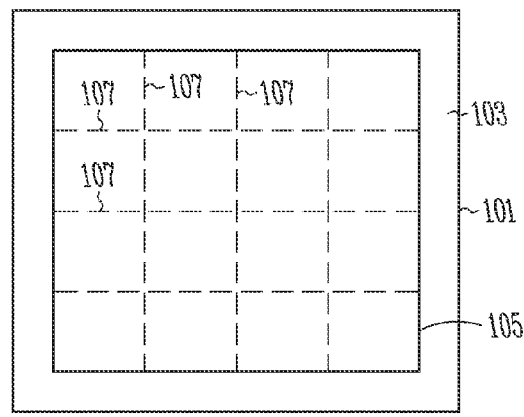
FIGS. 1A-1C show a bumped chip carrier of the prior art.
Figure 1B:
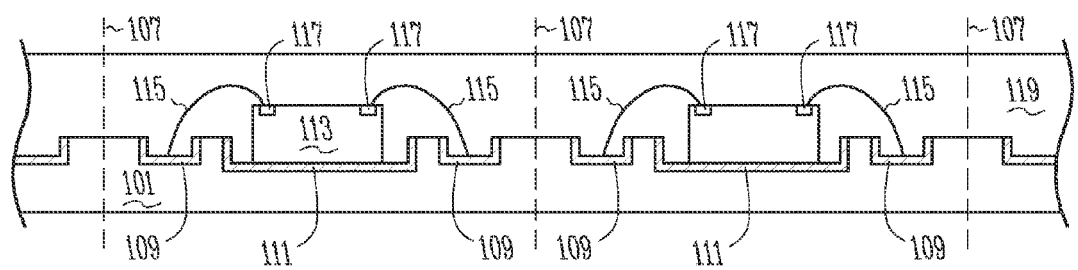
Figure 1C:
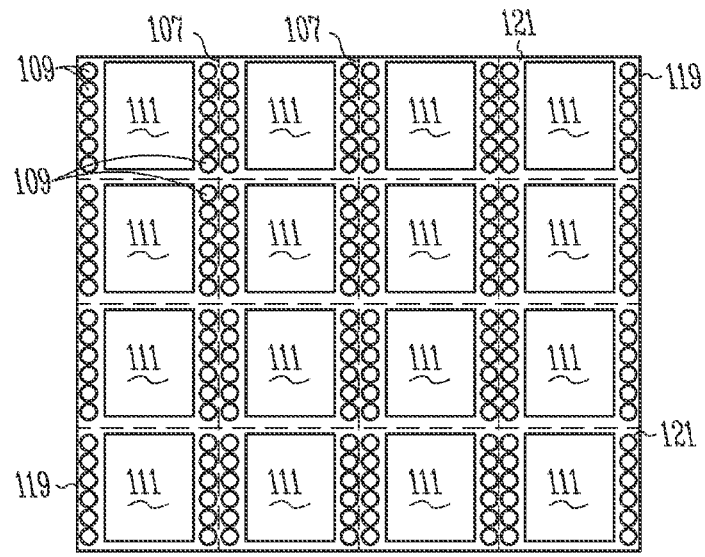
Figure 2A:
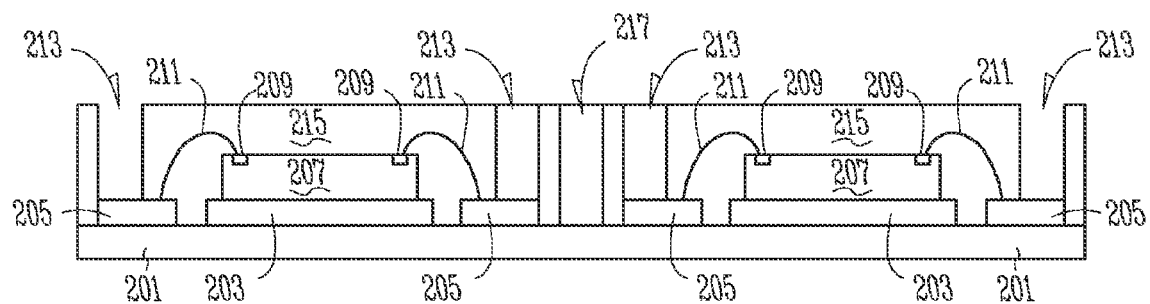
FIGS. 2A-2E show exemplary cross-sections of stackable integrated circuit die and discrete component carriers in accordance with embodiments of the present invention.

In FIG. 2A, a cross-sectional view of a potentially-stackable integrated circuit die and discrete component carriers includes a sacrificial metal base strip 201, a plurality of die mounting areas 203, and a plurality of wirebond pads 205. As shown, a plurality of integrated circuit dice 207 are mounted to corresponding ones of the plurality of die mounting areas 203. Alternatively, the plurality of integrated circuit dice 207 may also be discrete components (not shown) or a combination of integrated circuit dice and discrete components mounted to a plurality of die mounting areas. In one embodiment, the sacrificial metal base layer may be constructed from an electrically conducting non-metallic material such as, for example, polypropylene with embedded carbon particles or a polymer strip overplated with metal.

As known in the art, a thermally-conductive adhesive or adhesive tape (neither of which is shown) is commonly used for mounting the plurality of dice 207 to associated die mounting areas 203. As one skilled in the art will recognize, other types of adhesives (e.g., non-thermally conducting, electrically and non-electrically conducting, etc.) or other mounting techniques may be used as well. Each of the plurality of dice 207 includes a plurality of bonding pads 209. Once the plurality of dice 207 are mounted, a plurality of bonding wires 211 are used to electrically connect the plurality of bonding pads 209 to selected ones of the plurality of wirebond pads 205.

The plurality of wirebond pads 205, dice 207, and bonding wires 211 are typically encapsulated in a molding compound. The molding compound is introduced into a molding cavity (not shown) by a mold gate located at an edge of the sacrificial metal base strip 201. The molding compound is typically a polymeric precursor comprised of an epoxy base material filled with silica and anhydrides, requiring thermal energy for curing to form a polymeric encapsulant 215. The encapsulant 215 protects the fragile plurality of bonding wires 211 and their associated electrical connections, as well as the plurality of dice 207. In this embodiment, tubes 213 are located above each of the plurality of wirebond pads 205, thus forming tunnels after the encapsulant 215 is poured and formed. The tubes 213 may be formed by placing pins or other structures either into the mold or added afterwards (e.g., machined or welded into place into a mold cavity). Streets 217 indicate where the saw kerf is to run during a subsequent dicing operation.

Figure 2B:
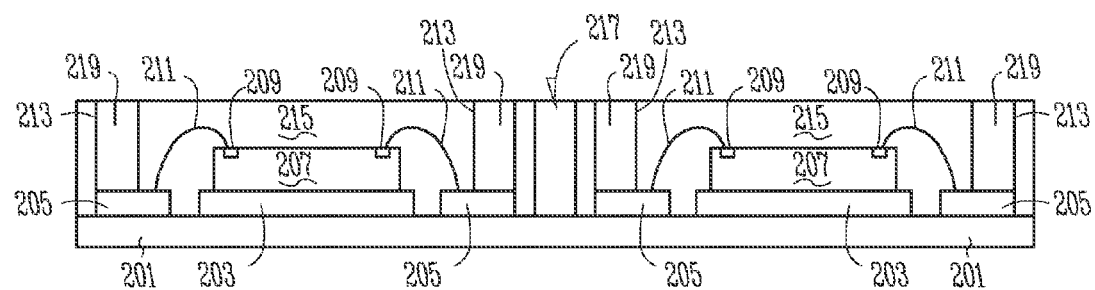

With reference to FIG. 2B, the tubes 213 have been filled with a conductor to produce a plurality of conducting metal contacts 219. In a specific exemplary embodiment, the sacrificial metal base strip 201 provides electrical continuity required for an electrolytic plating process so the plurality of conducting metal contacts 219 (e.g., copper) can be fabricated by filling the tubes 213 (FIG. 2A). Copper, or virtually any other metal, used for fabricating the plurality of conducting metal contacts 219 may then optionally be capped with, for example, nickel-gold alloy caps or another noble metal. Alternatively, the plurality of conducting metal contacts 219 may be fabricated by, for example, plating with materials such as tungsten or tantalum into the tubes 213. Additionally, a conductive epoxy or polymer may be used to fill the tubes 213. The conductive epoxy is then cured in place.

Figure 2C:
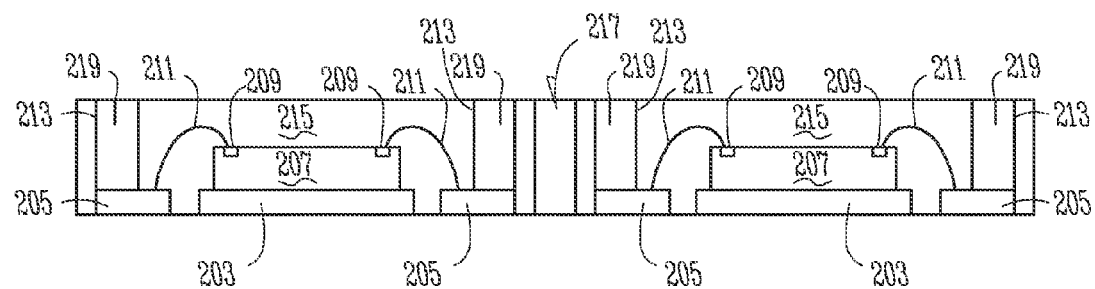
Figure 2D:
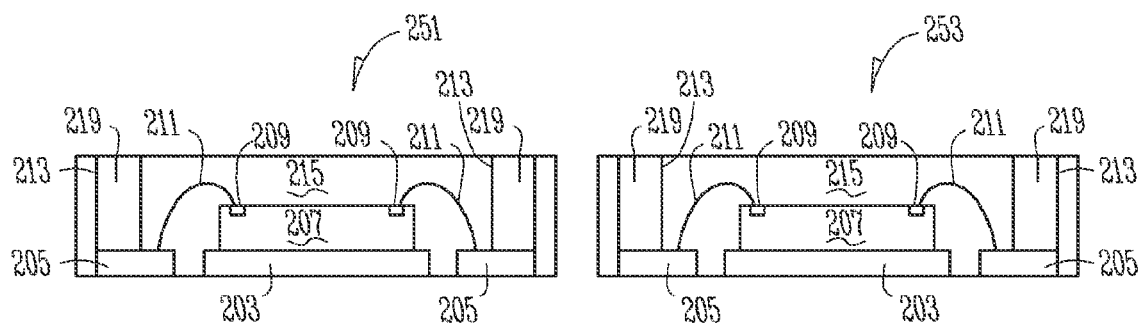

The sacrificial metal base strip 201 is then etch removed (FIG. 2C) by processes known in the art. Die mounting areas 203 and wirebond pads 205 may be plated with, for example, gold-nickel-gold or palladium-gold, such that only the alloy bonding areas are left intact after etch. The dice 207 are then singulated (FIG. 2D), for example, by a die saw or laser (not shown), producing a first 251 and a second 253 packaged product.

Figure 2E:
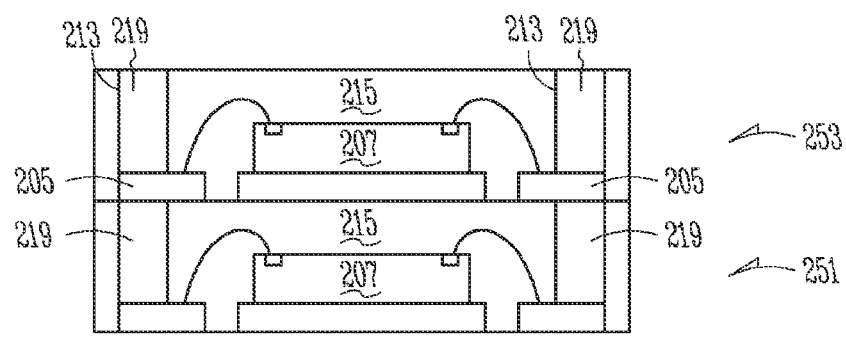

With reference to FIG. 2E, the singulated first 251 and second 253 packaged products are mechanically stacked. The plurality of conducting metal contacts 219 allow each of the wirebond pads 205 at one level (e.g., at the first packaged product 251) to be interconnected to another level (e.g., to the second packaged product 253) to be electrically connected through the use of solder (e.g., solder paste), conductive epoxy, metal bonding (e.g., through an application of ultrasonic or thermal forces), and so on. Thus, there is no limit on the number of packages that can be stacked.

In the foregoing specification, the present invention has been described with reference to specific embodiments thereto. It will, however, be evident to a skilled artisan that various modifications and changes can be made thereto without departing from the broader spirit and scope of the invention as set forth in the appended claims, For example, skilled artisans will appreciate that embodiments of the present invention may be readily applied to TAPP (thin array plastic package), ULGA (ultra-thin land grid array), BCC (bumped chip carrier), or other similar packages types. The specification and drawings are, accordingly, to be regarded in an illustrative rather than a restrictive sense.

The invention claimed is:

1. A method of forming a packaged product comprising:
forming a sacrificial base layer;
mounting an electrical component to a mounting area located on the sacrificial base layer;
securing a plurality of bond wires from a plurality of bonding pads on the electrical component to a corresponding plurality of wirebond pads located on the sacrificial base layer;
forming a plurality of conducting tunnels disposed over and in contact with the corresponding plurality of wirebond pads by
encapsulating the electrical component and the plurality of bond wires with a mold compound and
metalizing the plurality of conducting tunnels with an electrically conductive material to produce a plurality of metalized conducting tunnels to electrically couple the plurality of conducting tunnels to the corresponding plurality of wirebond pads; and
etch-removing the sacrificial base layer to form the packaged product.

2. The method of claim 1 further wherein the electrically conductive material is copper.

3. The method of claim 1 further comprising disposing an electrically conductive capping material over exposed ends of the metalized conducting tunnels.

4. The method of claim 3 wherein the capping material is a nickel-gold alloy.

5. The method of claim 1 wherein the mold compound is introduced into a molding cavity by a mold gate located at an edge of the sacrificial base layer and the method further comprises forming the plurality of conducting tunnels with tubes.

6. The method of claim 1 wherein the conducting tunnels are metalized by being filled with the electrically conductive material.

7. The method of claim 1 wherein the electrically conductive material is copper, a conductive epoxy or a conductive polymer.

8. The method of claim 1 wherein the plurality of conducting tunnels are metalized by being plated.

9. The method of claim 1 further comprising capping the plurality of metalized conducting tunnels with a metal.

10. The method of claim 9 wherein the metal is a noble metal.

11. The method of claim 9 further comprising:
stacking a plurality of packaged products on top of one another; and
electrically coupling a first packaged product to a second packaged product.

12. The method of claim 11 comprising at least two packaged products joined together at a street, wherein the method further comprises separating the at least two packaged products to form stackable singulated packaged products.

13. A product formed according to the method of claim 12.

14. The product of claim 13 comprising a thin array plastic package, an ultra-thin land grid array or a bumped chip carrier.

15. A method for forming a three-dimensional packaged product comprising:

forming a sacrificial base layer;
mounting an electrical component to a mounting area located on the sacrificial base layer;
securing a plurality of bond wires from a plurality of bonding pads on the electrical component to a corresponding plurality of wirebond pads located on the sacrificial base layer; forming a plurality of conducting tunnels disposed over and in contact with the corresponding plurality of wirebond pads by
encapsulating the electrical component and the plurality of bond wires with a mold compound
metalizing the plurality of conducting tunnels with an electrically conductive material to produce a plurality of metalized conducting tunnels to electrically couple the plurality of conducting tunnels to the corresponding plurality of wirebond pads;
etch-removing the sacrificial base layer to form a packaged product;
stacking at least a second packaged product on top of a first packaged product; and
electrically coupling the first packaged product to the second packaged product to form the three-dimensional packaged product.

16. The method of claim 15 wherein the first and second packaged products are joined together at a street and the method further comprises, prior to stacking the first and second packaged products, separating the first and second packaged products along the street.

17. The method of claim 15 further comprising stacking additional packaged products on top of the first and second packaged products.

18. A product formed according to the method of claim 15.

* * * * *